United States Patent [19]

Smith, Jr. et al.

[11] 4,297,189

[45] Oct. 27, 1981

[54] DEPOSITION OF ORDERED CRYSTALLINE FILMS

[75] Inventors: Elroy C. Smith, Jr., La Habra; Shi K. Yao, Anaheim, both of Calif.

[73] Assignee: Rockwell International Corporation, El Segundo, Calif.

[21] Appl. No.: 163,532

[22] Filed: Jun. 27, 1980

[51] Int. Cl.³ ............................................. C23C 15/00
[52] U.S. Cl. .......................... 204/192 SP; 204/192 R; 204/298
[58] Field of Search ......... 204/192 R, 192 C, 192 SP, 204/192 PE, 192 S, 298

[56] References Cited

U.S. PATENT DOCUMENTS

| | | | |
|---|---|---|---|
| 3,361,659 | 1/1968 | Bertelson | 204/192 |
| 3,526,584 | 9/1970 | Shaw | 204/192 |
| 3,562,142 | 2/1971 | Lamont, Jr. | 204/298 |
| 3,677,924 | 7/1972 | Cash, Jr. et al. | 204/192 |
| 3,766,041 | 10/1973 | Wasa et al. | 204/192 |
| 3,897,325 | 7/1975 | Aoshima et al. | 204/298 |
| 3,988,232 | 10/1976 | Wasa et al. | 204/192 |
| 4,006,073 | 2/1977 | Welch | 204/298 |
| 4,094,764 | 6/1978 | Boucher et al. | 204/298 |
| 4,096,055 | 6/1978 | Johnson | 204/298 |
| 4,158,589 | 6/1979 | Keller et al. | 156/345 |

OTHER PUBLICATIONS

N. Chubachi, "ZnO Films for Surface Acoustooptic Devices On Non-Piezoelectric Substrates", *Proceedings IEEE*, vol. 63, pp. 772-774, (1976).

*Primary Examiner*—Aaron Weisstuch
*Attorney, Agent, or Firm*—H. Frederick Hamann; Gilbert H. Friedman

[57] ABSTRACT

Deposition of ordered polycrystalline films of zinc oxide and other materials having a strongly preferred crystal growth direction and a high degree of symmetry about the preferred direction is achieved consistently by disposing a charged electrode in a sputtering chamber to limit bombardment of the film and underlying substrate by charged particles.

29 Claims, 5 Drawing Figures

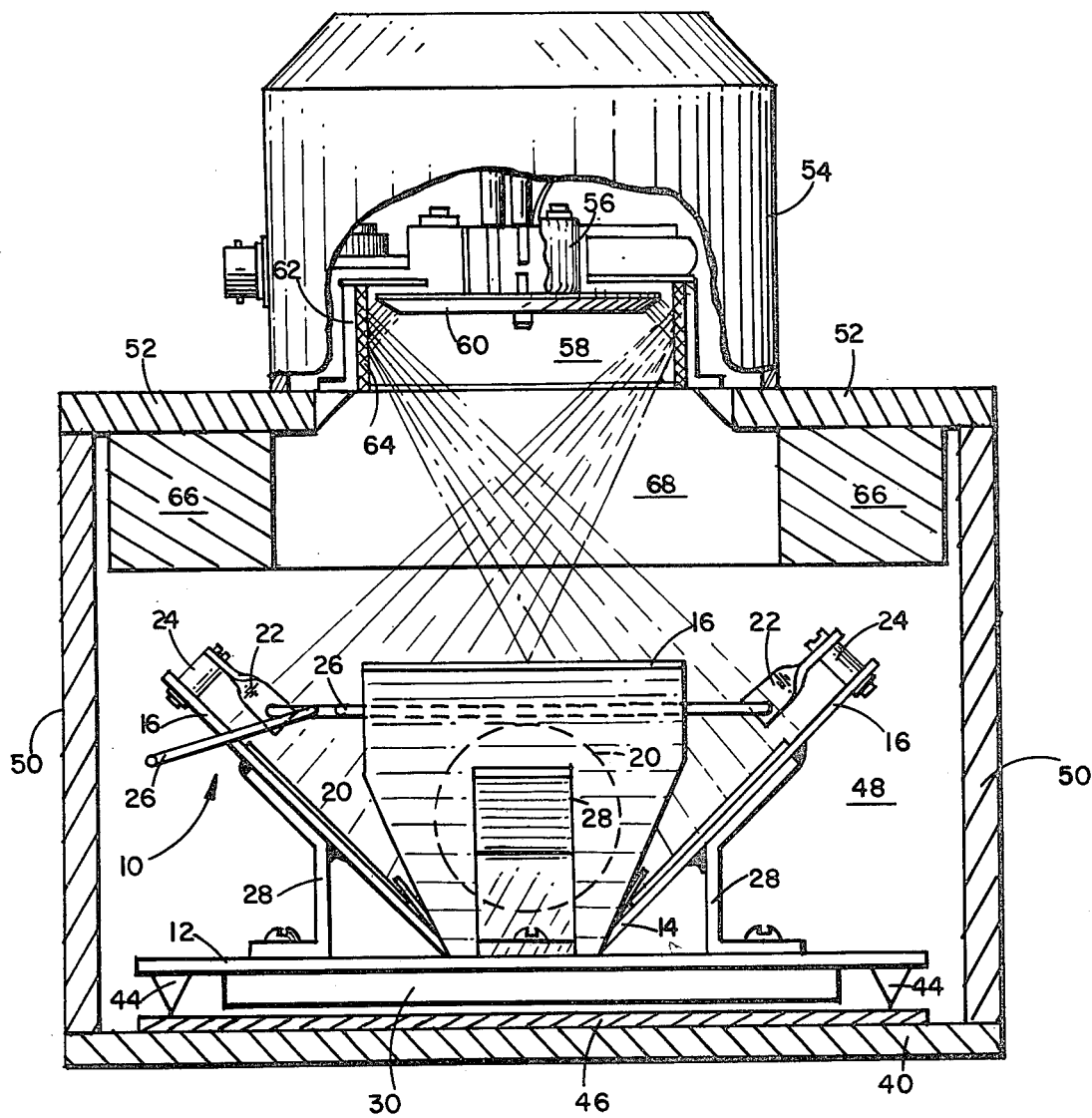
FIG. 3
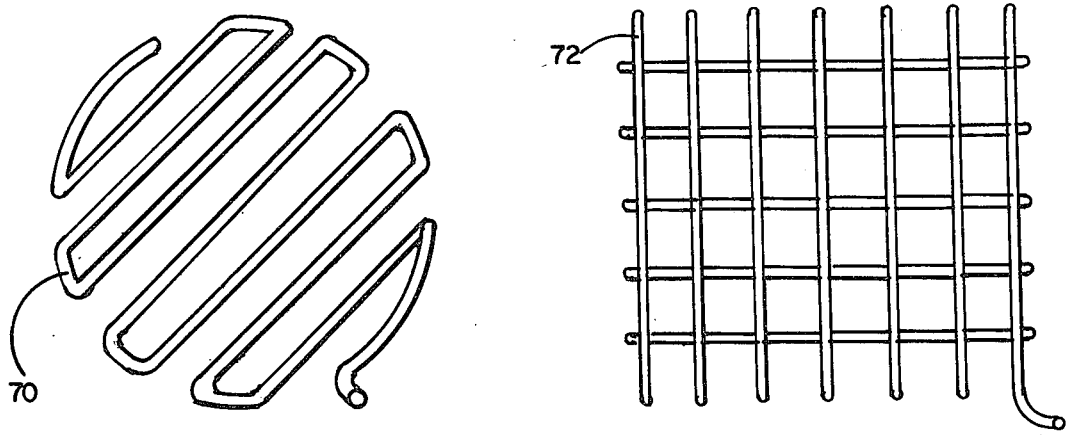
FIG. 4
FIG. 5

DEPOSITION OF ORDERED CRYSTALLINE FILMS

BACKGROUND OF THE INVENTION

1. Field of the Invention

This invention relates to the deposition of films of ordered polycrystalline material.

2. Description of the Prior Art

As is well known, sputtering apparatus has a chamber adapted for the removal of material from a target by ionic bombardment and for the deposition of that material on the surface of a selected object.

It has long been desired to find ways to use sputtering apparatus to consistently produce high-quality films of ordered polycrystalline material. In such films, certain of the characteristics of the material are substantially the same as in a wafer of the material cut from a single crystal. This correspondence occurs because the responses of the individual crystallites to physical stimuli add coherently. For example, films of ordered polycrystalline zinc oxide have substantially the same piezoelectric properties as single-crystal zinc oxide. Therefore, such films are useful for fabricating devices which utilize the piezoelectric properties of the material such as, for example, surface acoustic wave devices.

Such films of ordered polycrystalline zinc oxide having strong piezoelectric properties have been successfully formed in various sputtering equipments under controlled laboratory conditions. However, the procedures followed have not given consistent results. Some of the zinc oxide films deposited using prior-art techniques are of excellent quality but other films, deposited under what appear to be identical or similar conditions, are relatively amorphous and therefore of poor quality. Such inconsistency and lack of reproducibility has precluded use of these procedures in a production environment. The unavailability of means for consistently and repeatably forming ordered films of polycrystalline material has, for example, inhibited wider use of piezoelectric films and surface acoustic wave phenomena in a variety of integrated devices.

SUMMARY OF THE INVENTION

The general purpose of this invention is to provide apparatus and a method for consistently and repeatably depositing high-quality films of ordered polycrystalline material on objects placed for that purpose in a sputtering apparatus chamber. To attain this, the present invention provides a unique means in the chamber and a unique procedure for using the sputtering apparatus wherein flow of plasma, or charged particles, to the surface of the objects and to the films being deposited thereon is significantly reduced or eliminated. This effect is achieved by disposing a charged electrode in the sputtering chamber in the vicinity of objects on which films of ordered polycrystalline material are desired to be deposited. The electrode is preferably held at a positive potential relative to the chamber walls and floor so that stray electrons are attracted to the electrode and positively charged ions are repelled by it. The electrode is so disposed that the charged particles are deflected from trajectories which would otherwise cause them to bombard the surface of the object being coated by the sputtered material. Stated alternatively, the electrode is so disposed as to limit the extent of the plasma in the chamber to a region which is spaced apart from the site of deposition. Those electrons which are collected and removed by the electrode cannot collide with and ionize gas atoms in the chamber. The plasma is thereby prevented from contacting the films during deposition.

By thus reducing the bombardment and accumulation of charge on the substrate and on the film being deposited thereon, factors which tend to disturb the growth of ordered crystallites appear to have their effect reduced or eliminated. Experience has shown that high-quality films of ordered polycrystalline zinc oxide can be formed repeatably and consistently when a charged electrode in accord with the invention is used in sputtering apparatus.

The invention thus provides a low-cost alternative to the use of single-crystal material in devices which can utilize the single-crystal properties of the material. It also provides an opportunity to incorporate and integrate such devices into monolithic assemblies with electronic and photonic (optoelectronic) devices.

The invention is applicable to the formation of an ordered polycrystalline film of a material which has a strongly preferred crystal growth direction and wherein the crystal has a high degree of symmetry about this preferred direction. Materials having a hexagonal crystal structure frequently have such a strongly preferred crystal growth direction. Zinc oxide, sapphire, and beryllium oxide are such materials. The other chalcogenides which have a hexagonal crystal structure such as, for example, zinc sulfide and cadmium sulfide are believed to be included in this description. Other good possibilities for inclusion in this group of materials are certain phases of titanium oxide, vanadium oxide, chromium oxide, gallium oxide, cesium oxide and mercury oxide, all having hexagonal crystal structure, and certain phases of barium oxide and palladium oxide having tetragonal crystal structure.

Certain aspects of the utility of thin films of piezoelectric material in forming new types of surface acoustic wave devices are described in R. R. August et al., "Surface Acoustic Wave Device Having Buried Transducer," a U.S. Patent Application Ser. No. 163,533 filed concurrently herewith and assigned to Rockwell International Corporation, the assignee herein.

BRIEF DESCRIPTION OF THE DRAWINGS

FIG. 3 is a sketch of the interior of a sputtering chamber having the fixture of FIG. 1 disposed therein.

FIG. 4 shows an alternative form for an electrode.

FIG. 5 shows another alternative form for an electrode.

DESCRIPTION OF THE PREFERRED EMBODIMENT

Figure 1:
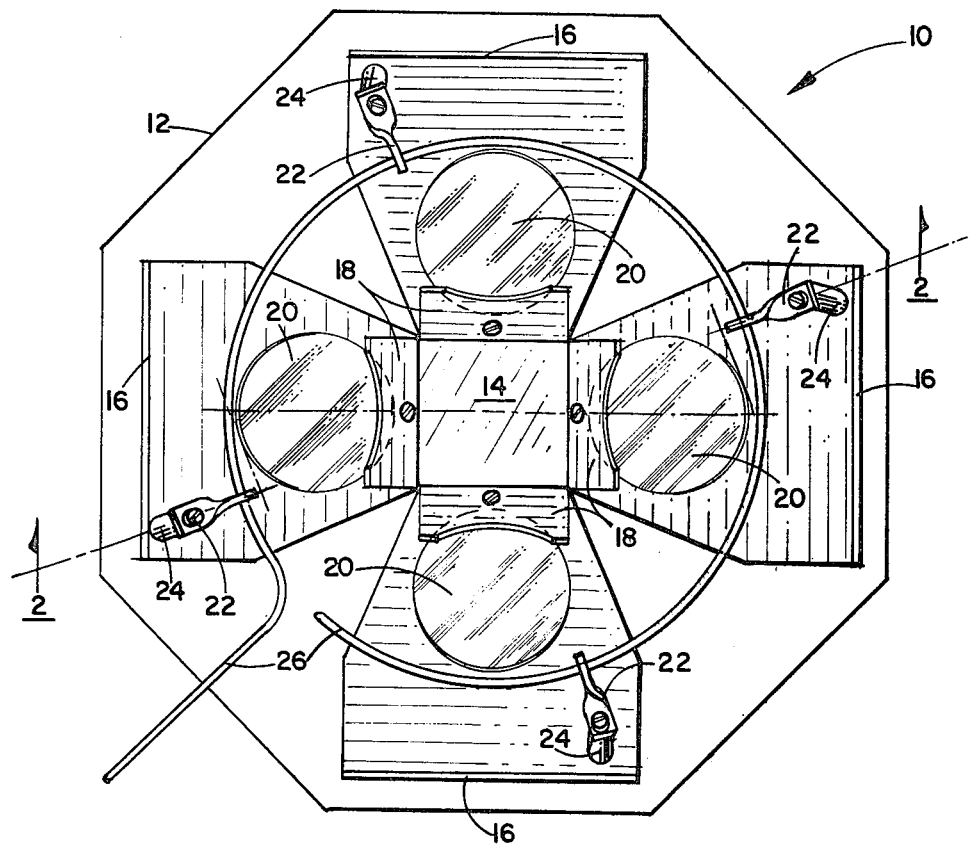
FIG. 1 is a plan view sketch of a fixture in accord with the invention.

The apparatus and method described more fully hereinafter were developed in conjunction with the use of a 3-inch cross-field radio frequency (RF) magnetron sputtering system manufactured and sold by the Sloan Technology Corporation of 535 E. Montecito St., Santa Barbara, Calif. 93103 and designated by the trademark S-310 Sputtergun.

The work actually done was confined to the deposition of polycrystalline films of zinc oxide. Therefore, where numerical values and other specific information are given hereinafter, it is to be understood that these values and other information have been determined under this limited set of circumstances. Nevertheless, it is believed that the broader implications of the invention are applicable to the deposition in any suitable sputtering apparatus of ordered polycrystalline films of not only zinc oxide but also of other materials having a strongly preferred crystal growth direction and a high degree of symmetry about this preferred direction, as discussed above.

Determination of whether or not a film of polycrystalline zinc oxide is sufficiently ordered to be regarded as high in quality can be made using a reflected electron diffractometer or by x-ray analysis. In addition, such an ordered zinc oxide film is said to be of high quality only when the c-axes of the crystallites extend normal or nearly normal to the surface of the substrate on which the film is deposited, when the zinc oxide has relatively high electrical resistivity, and when surface acoustic waves propagate on the film with relatively low losses.

The quality of a film of zinc oxide deposited on a selected object or substrate in a sputtering chamber is affected by variations in the parameters of the sputtering process. Some of the parameters which are required to be controlled if high quality is to be achieved are as follows: (1) overall gas pressure, (2) oxygen partial pressure, (3) gas mass flow rate, (4) minimum film thickness, (5) substrate surface orientation, (6) preparation of target and substrate prior to sputtering, (7) RF sputtering power, (8) deposition rate, (9) target to substrate spacing and (10) substrate and film temperature.

The overall or total gas pressure in the chamber of a sputtering apparatus is required to be high enough for a stable plasma, but low enough for adequately high deposition rates. The gas is predominantly an inert gas, preferably argon. For the S-310 Sputtergun, the manufacturer suggests a sputtering pressure of 5 to 15 microns. An overall pressure of 6.8±0.1 microns was used to obtain the results discussed herein.

A partial pressure of oxygen is preferably maintained in the chamber both during the sputtering run and also afterwards while the materials are cooling in order to provide some excess oxygen and thereby insure stoichimetry of the zinc oxide films. Non-stoichiometric films tend to be zinc rich. Their resistivity is therefore relatively low. Propagation of light waves or acoustic waves in such films is lossy.

During sputtering, the partial pressure of oxygen is preferably about ten percent of the total pressure. This may be obtained, for example, by first bleeding oxygen into the evacuated vacuum chamber until the pressure is at about ten percent of the desired total pressure. During the cooling period, the oxygen partial pressure is preferably held at about 200 microns.

The mass flow rate of argon should also be held relatively constant during sputtering at a relatively low rate to avoid unduly reducing the partial pressure of zinc oxide. A mass flow rate of about 25 standard cubic centimeters per minute of argon produced good results.

It appears that a film of polycrystalline zinc oxide must be deposited to a certain minimum thickness before its properties are such that the film can be considered high in quality. In the work done, consistently good results were obtained for deposits on substrates of glass or gold when the zinc oxide film thickness was greater than about 2000 angstroms. For deposition on aluminum, however, film thicknesses greater than 8,000 angstroms gave consistent good results. Deposition of high quality films on aluminum is of importance, for example, in surface acoustic wave applications where the film is required to be deposited over an interdigital transducer since the preferred material for these transducers is aluminum.

Uniformity of film thickness has been found to vary with the spatial orientation of the surface on which the film is deposited. Film thickness is found to be relatively uniform when a line normal to the deposition surface is oriented at an angle of about 60 degrees away from the vertical in a chamber having the target mounted in the ceiling. At this orientation, the surface is substantially normal to the net flux from the target. Uniformity of film thickness is desired since thin spots in the film may be deficient in quality, as indicated above.

It is desirable to preheat the target by sputtering with a closed shutter for about ten minutes because the intial target temperature determines the initial deposition rate. Also, this target sputtering prior to the time deposition is begun eliminates adsorbed or absorbed moisture, nitrogen and air which may be present. When a film of material is to be deposited on aluminum, it may be desirable to sputter etch the aluminum within just a few seconds of the time when deposition begins in order to remove aluminum oxide from the metal surface and thereby provide a more uniform, smooth surface for ordered growth of crystallites.

RF sputtering power is preferably maintained relatively low at about 500 watts with the equipment mentioned.

The deposition rate is preferably maintained relatively low at about 70 to 85 angstroms per minute.

It also appears that more consistently satisfactory results are obtained as the distance between the target and the substrates is increased. Results obtained at a target-to-substrate spacing of seven inches were observed to be better than at a spacing of six inches and the results obtained at a spacing of six inches were observed to be better than at five inches.

Control of the temperature at which deposition occurs is believed to be critical. As is known, there exists a temperature at which nucleation is maximum and another, different temperature at which growth of an established crystallite is at a maximum. Maximum growth on a smaller number of crystallites is believed to be more likely to produce a high-quality ordered deposit than is growth on a larger number of crystallites. That is because the growth on a larger number of crystallites is likely to be more random. More consistent production of high-quality films of zinc oxide was procured when the temperature of the substrate was controlled to lie in the range from 180 to 200 degrees centigrade.

Referring now to FIG. 1, there is shown a fixture 10 for holding objects or substrates on which films of ordered polycrystalline material are to be deposited. A base plate 12 of a heat conducting material such as aluminum is provided. A second plate 14, preferably of the same heat conducting material, is firmly attached for good heat conduction to the base plate 12 at their respective centers. The second plate 14 is segmented to form four angled mounting plates 16 radiating outward from the central region of the plate 14.

The upper surface of each mounting plate 16 is provided with a clamp 18 for holding a substrate 20 in close thermal contact with the mounting plate 16. The mounting plates 16 and clamps 18 are adapted to hold substrates 20 having a variety of shapes and sizes.

Figure 2:
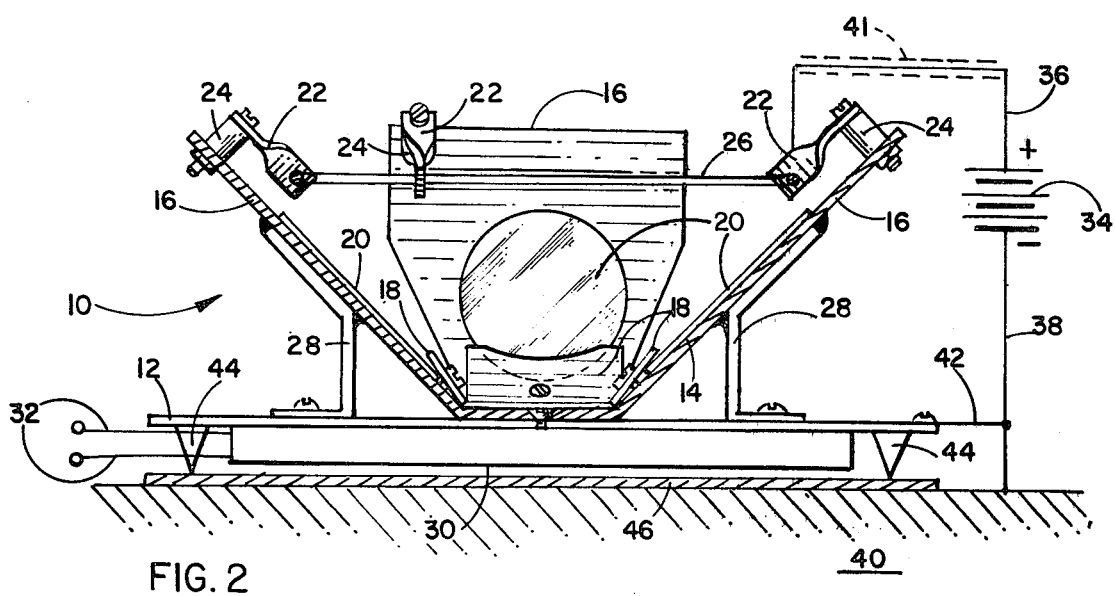
FIG. 2 is a view in elevation of the fixture, partly in cross-section, taken along the line 2—2 of FIG. 1 looking in the direction of the arrows.

Each mounting plate 16 also has a bracket 22 mounted on the upper surface thereof by a standoff 24 of electrically insulating material. The brackets 22 collectively support an electrode 26 according to the invention formed as a ring and disposed above the substrates 20. The electrode 26 is preferably electrically isolated from the remainder of the fixture 10 by the standoffs 24. Although the electrode 26, as shown in FIGS. 1, 2 and 3, is a substantially circular ring, circularity is not a requirement. The ring may have any convenient shape.

The elevation view of the fixture 10 in FIG. 2 shows that each of the mounting plates 16 is supported by an angle adjustment brace 28 bolted to the base plate 12 and welded to the mounting plate 16 for good heat conduction. The angle at which the mounting plate 16 is disposed is selected to receive the net flux of material from the target substantially normal to its upper surface, as discussed above and as illustrated in FIG. 3.

Secured to the underside of the base plate 12 is a heater block 30 of electrically-insulating, heat-conducting ceramic material. The heater block 30 has chambers in which are mounted electrical resistance heating elements (not shown). A pair of wires 32 is shown extending from heating block 30 for use in connecting the heating elements to an electrical power supply. The function of the heater 30 is to maintain the substrates 20 and the films deposited thereon at the desired temperature for deposition, as discussed above. To aid in controlling the temperature, a thermocouple (not shown) may be connected at a convenient point on the fixture 10 to provide a signal indicative of the temperature.

As will be apparent to those skilled in the art, alternative means of heating the substrates 20 such as, for example, heat lamps may be satisfactorily used.

A source 34 of a bias voltage is shown diagrammatically in FIG. 2 connected by wires 36 and 38 between the electrode 26 and the floor of a sputtering chamber held at ground potential as indicated at 40. The conductor 36 is shown protected by a sleeve 41 of conductive material such as aluminum foil for shielding the biasing circuit from RF noise emitted by the plasma.

As indicated above, the bias source 34 is preferable arranged to hold the electrode 26 at a positive voltage relative to the chamber floor 40. A bias of +15 volts is preferred. The fixture 10 itself may be allowed to float or it may be biased at the same voltage as the electrode 26. However, the fixture 10 is preferably grounded as shown by the connection of the conductor 42 between the base plate 12 and the floor 40.

In order to thermally isolate the fixture 10 from the floor 40, the fixture 10 is preferably supported on feet 44 having a narrow conduction path. To further increase the thermal resistance, a slab 46 of thermally-insulating material is interposed between the fixture feet 44 and the chamber floor 40.

The fixture 10 is shown in FIG. 3 disposed in a sputtering chamber 48 having a floor 40, walls 50 and a ceiling 52. The pair of wires 32 for supplying power to heater elements in the heater block 30 is omitted from FIG. 3 for convenience. Also omitted from FIG. 3 for convenience is the bias voltage source 34 along with its connecting circuitry. The electrical supplies for heating and bias (not shown) are located outside the chamber 48. Access for conductors to the interior of the chamber 48 is provided through vacuum feedthroughs (not shown) in the walls 50.

A housing 54 for the sputtering elements is mounted on top of the chamber 48. An anode assembly 56 is disposed in the upper part of an antechamber 58 which leads to the main chamber 48. A disk-type anode plate 60 is surrounded by a target cathode 64 which is a hollow cylinder mounted in a cathode assembly 62. The target 64 is spaced apart from the anode 60 by a small distance.

The target 64 and the anode 60 are preferably cleaned by sand blasting before sputtering is begun.

As discussed above, the distance from the target 64 to the substrates 20 is preferably about seven inches. Also, the fixture 10 is preferably centered under the target 64.

A rotatable gate 66 having an opening 68 therein operates as a shutter to either permit flux from the target 64 to enter the main chamber 48 or to exclude it.

The electrode 26 has been represented in FIGS. 1, 2 and 3 as a ring. While this form is a preferred embodiment, it will be apparent to those skilled in the art that electrodes having various different forms may serve in the invention equally well. For example, an electrode for use in the invention could include several concentric rings. As another example, an electrode for use in the invention can be formed as the electrode 70 of FIG. 4 which is shown as a type of grid. As yet another example, an electrode for use in the invention can be formed as the electrode 72 of FIG. 5 which is shown as a type of screen.

It is believed that one reason a charged electrode 26, 70 or 72 in accord with the invention produces the desired result is that, in preventing or reducing the bombardment of the film growing on a substrate 20 with charged particles, a resultant localized uncontrolled heating of the substrate 20 and film is also prevented. Where the charged particles are permitted to reach the substrate 20 and the film thereon, random growth of an increased number of crystallites may occur. The accumulation of charge may also encourage random growth by the occurrence of arcing which would induce crystal defects.

While the invention has been described with respect to the preferred embodiment thereof, it will be understood by those skilled in the art that various changes in form and details may be made therein without departing from the spirit and scope of the invention.

What is claimed is:

1. Apparatus for forming films of ordered polycrystalline material, comprising:
   a cross-field radio frequency magnetron sputtering apparatus having a chamber adapted for the removal of material from a hollow cylindrical target cathode by ionic bombardment and for the deposition of said material on the surface of a selected object, wherein the elements for sputtering include said cathode and a central disk type anode, both mounted at the top of said chamber spaced apart from each other by a small distance;
   a fixture for supporting said selected object spaced apart from said sputtering elements by a significant distance, said fixture having means for mounting said selected object disposed at an angle relative to said sputtering elements, wherein said angle is selected to cause the net flux of said material from said cathode to be received by said selected object substantially normal to its upper surface; and means for deflecting charged particles away from said selected object, said deflecting means comprising an electrode disposed on said fixture in the vicinity of a mounting location for said selected object, wherein said electrode is electrically isolated from said sputtering elements; and means for applying a fixed electric potential to said electrode.

2. The apparatus recited in claim 1, wherein said electrode is insulated from said fixture.

3. The apparatus recited in claim 2, wherein said means for applying a fixed electric potential holds said electrode at a positive potential.

4. The apparatus recited in claim 3, wherein said fixture is grounded to the interior of said chamber.

5. The apparatus recited in claim 3, wherein said fixture is electrically floating.

6. The apparatus recited in claim 3, wherein said positive potential is about fifteen volts.

7. The apparatus recited in claim 1, wherein said electrode comprises a ring.

8. The apparatus recited in claim 1, wherein said electrode comprises a grid.

9. The apparatus recited in claim 1, wherein said electrode comprises a screen.

10. The apparatus recited in claim 1, wherein said means for applying a fixed electric potential holds said electrode at a positive potential.

11. The apparatus recited in claim 10, wherein said fixture is held at the same potential as said electrode.

12. The apparatus recited in claim 10, wherein said positive potential is about fifteen volts.

13. A method of forming a film of ordered polycrystalline material on a selected object in a cross-field radio frequency magnetron sputtering chamber having sputtering elements in the ceiling thereof, said method comprising the steps of:

orienting a line normal to the deposition surface of said selected object at an angle of about sixty degrees away from the vertical; and deflecting charged particles away from said selected object by means of a positively charged electrode disposed in the vicinity of said selected object and spaced a significant distance away from said sputtering elements, wherein said electrode is electrically isolated from said sputtering elements.

14. The method recited in claim 13, wherein said material has a strongly preferred crystal growth direction.

15. The method recited in claim 14, wherein said material has a high degree of symmetry about said preferred crystal growth direction.

16. The method recited in claim 15, wherein said material has a hexagonal crystal structure.

17. The method recited in claim 16, wherein said material is zinc oxide.

18. The method recited in claim 17, further comprising the step of depositing said film to a minimum thickness of about 2000 angstroms and to a minimum thickness of at least about 8000 angstroms when said selected object includes aluminum on the surface thereof.

19. The method recited in claim 18, further comprising the step of maintaining a partial pressure of oxygen in said chamber at about ten percent of the total pressure during sputtering and at about 200 microns during cooling.

20. The method recited in claim 19, further comprising the step of controlling the temperature of said selected object to lie in the range from 180 to 200 degrees centigrade during deposition.

21. The method recited in claim 20, further comprising the step of maintaining the deposition rate of said material relatively low at about 70 to 85 angstroms per minute.

22. The method recited in claim 21, further comprising the step of preheating the target cathode of said chamber prior to the time deposition is begun.

23. The method recited in claim 22, further comprising the step of sputter etching the surface of said selected object prior to the time deposition is begun.

24. The method recited in claim 23, further comprising the step of maintaining a mass flow rate of argon in said chamber of about twenty-five standard cubic centimeters per minute.

25. The method recited in claim 24, further comprising the step of maintaining a total gas pressure in said chamber at about 6.8 microns.

26. The method recited in claim 16, wherein said material is zinc oxide, sapphire, or beryllium oxide.

27. The method recited in claim 16, wherein said material is a chalcogenide.

28. The method recited in claim 16, wherein said material is vanadium oxide, chromium oxide, gallium oxide, cesium oxide, mercury oxide, or titanium oxide.

29. The method recited in claim 15, wherein said material is barium oxide or palladium oxide.

* * * * *